(12) United States Patent
Ochi et al.

(10) Patent No.: US 7,141,975 B2
(45) Date of Patent: Nov. 28, 2006

(54) NUCLEAR MAGNETIC RESONANCE SYSTEM

(75) Inventors: Hisaaki Ochi, Kodaira (JP); Kazuo Saitoh, Kodaira (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 9 days.

(21) Appl. No.: 11/032,010

(22) Filed: Jan. 11, 2005

(65) Prior Publication Data

US 2006/0055407 A1 Mar. 16, 2006

(30) Foreign Application Priority Data

Mar. 2, 2004 (JP) ............... 2004-057464

(51) Int. Cl.
*G01V 3/00* (2006.01)
(52) U.S. Cl. ..................... 324/318; 324/322
(58) Field of Classification Search .............. 324/318, 324/322
See application file for complete search history.

(56) References Cited

U.S. PATENT DOCUMENTS

| | | | |
|---|---|---|---|
| 4,641,098 A | 2/1987 | Doty | |
| 4,721,913 A | 1/1988 | Hyde et al. | |
| 4,996,481 A | 2/1991 | Ackerman et al. | |
| 5,180,982 A | 1/1993 | Zeiger | |
| 5,247,256 A | 9/1993 | Marek | |
| 5,323,113 A | 6/1994 | Cory | |
| 5,585,723 A | 12/1996 | Withers | |
| 5,680,044 A | 10/1997 | McDougall et al. | |
| 5,680,047 A * | 10/1997 | Srinivasan et al. | 324/318 |
| 5,929,639 A | 7/1999 | Doty | |
| 6,060,882 A * | 5/2000 | Doty | 324/318 |
| 6,175,237 B1 * | 1/2001 | Doty et al. | 324/318 |
| 6,320,384 B1 * | 11/2001 | Doty et al. | 324/321 |
| 2002/0145427 A1 | 10/2002 | Wong et al. | |

OTHER PUBLICATIONS

Duensing et al "A 4-Channel Volume Coil for Vertical Field MRI" Proceedings of the International Society for Magnetic Resonance In Medicine, 8th Scientific Meeting And Exhibition, Denver, Colorado, USA Apr. 1-7, 2000, (pp. 1398).

* cited by examiner

*Primary Examiner*—Louis M. Arana
(74) *Attorney, Agent, or Firm*—Antonelli, Terry, Stout and Kraus, LLP.

(57) ABSTRACT

An NMR system that enables multiplex resonance measurement includes a superconductivity reception coil, a transmission coil, and four electric current loops. The NMR system also includes an additional coil in which directions of currents that flow in an inner loop and an outer loop are opposite to each other. The additional coil and the transmission coil are arranged such that a direction of a high frequency magnetic field that is developed in the center of the additional coil when electricity is fed to the additional coil is substantially identical with a direction of a high frequency magnetic field that is developed in the center of the transmission coil when electricity is fed to the transmission coil. The electric current loop of the transmission coil is arranged substantially in the middle of the inner loop and the outer loop of the additional coil in which directions of electric currents that flow in the inner loop and the outer loop are opposite to each other.

6 Claims, 10 Drawing Sheets

NUCLEAR MAGNETIC RESONANCE SYSTEM

CLAIM OF PRIORITY

The present invention claims priority from Japanese application JP 2004-057464 filed on Mar. 2, 2004, the content of which is hereby incorporated by reference on to this application.

BACKGROUND OF THE INVENTION

The present invention relates to a nuclear magnetic resonance (NMR) system that enables multiplex resonance measurement which generates a plurality of frequencies at the same time and measures the resonance of a plurality of nuclears.

For the purpose of enhancing the resolution of a nuclear magnetic resonance (NMR) spectroscopy, there has been developed the NMR system that is capable of supplying a high frequency signal with a high resonance frequency under a uniform high magnetic field ($B_0$). In order to generate a high magnetic field of 10 or higher tesla (T), a superconductivity magnet is generally employed. Currently, there has been developed a high magnetic field NMR system mainly intended for structural analysis of protein material, and an NMR system of 21.6 T (920 MHz) is produced. In order to achieve analysis with high precision, it is necessary to enhance the uniformity of a magnetic field intensity, and it is desirable that a variation of the magnetic field intensity in a region where a sample to be measured exists is $10^{-9}$ or less.

On the other hand, a high sensitivity is demanded for a probe that receives a free induction decay (FID) signal generated according to a supplied high frequency pulse. This is because in the case where the amount of sample is small as with protein material, the FID signal intensity is particularly low, and a long period of time is required for measurement. The main noise in the probe is derived from an electric resistance of the probe that constitutes a resonator, and depends on the temperature and the high frequency loss resistance of the material. In order to reduce the noise, a probe coil and a preamplifier are located at a low temperature, and there is used a high temperature superconductivity material that is lower in the high frequency loss resistance than normal metal such as copper by two figures or more, as disclosed in U.S. Pat. No. 5,247,256.

An example using the high temperature superconductivity material for the probe coil is disclosed in U.S. Pat. No. 5,585,723. A thin film is used as the superconductivity material, and a film surface is required to be arranged in parallel with a direction of a static magnetic field. This is because when the film surface of the superconductivity material is located in a direction orthogonal to the static magnetic field, the uniformity of the static magnetic field intensity is deteriorated by a full diamagnetic characteristic of the superconductivity material.

Also, it is necessary that the probe coil is arranged in such a manner that the high frequency magnetic field is orthogonal to the static magnetic field when an electricity is fed to the probe coil. Since a sample tube into which a sample to be measured is incorporated is inserted in a vertical direction, the following arrangement is used.

In the following description, an NMR system using the superconductivity magnet that generates a static magnetic field in a horizontal direction is called "horizontal NMR system", and an NMR system using the superconductivity magnet that generates a static magnetic field in a vertical direction is called "vertical NMR system".

Figure 1A:
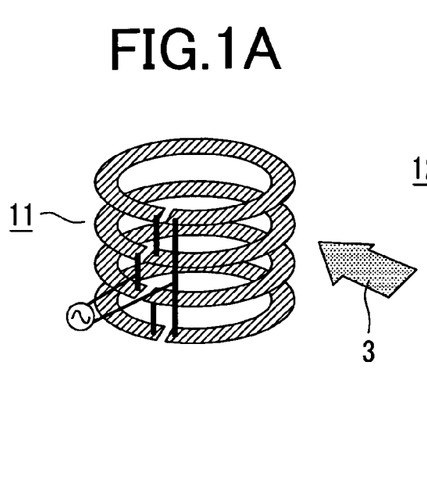
FIG. 1A is a perspective view showing a superconductivity solenoid coil according to a conventional horizontal NMR system.
Figure 1B:
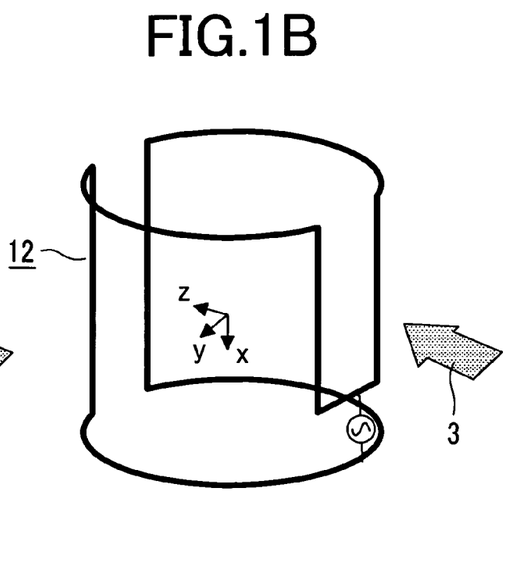
FIG. 1B is a perspective view showing a saddle coil according to the conventional horizontal NMR system.
Figure 1C:
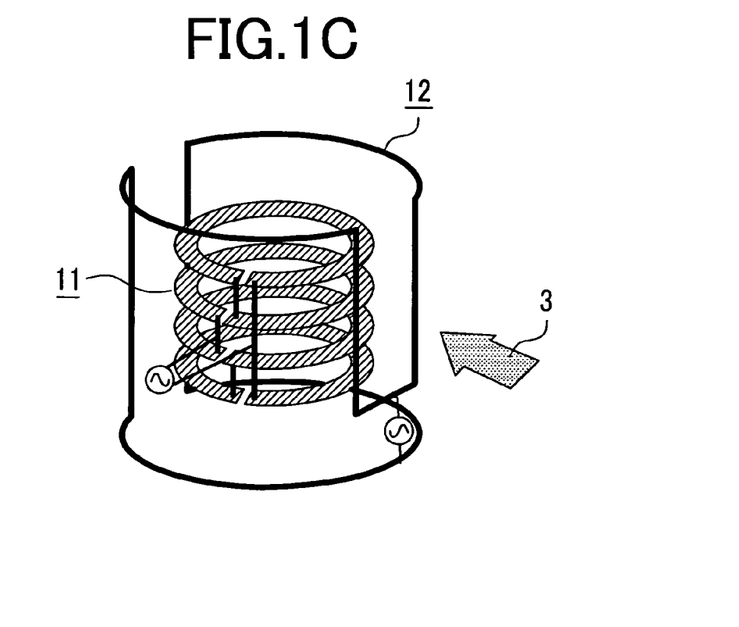
FIG. 1C is a perspective view showing the arrangement of the superconductivity solenoid coil and the saddle coil according to the conventional horizontal NMR system.

FIGS. 1A to 1C show a conventional horizontal NMR system, in which FIG. 1A is a perspective view of a superconductivity solenoid coil 11, FIG. 1B is a perspective view of a saddle coil 12, and FIG. 1C is a perspective view showing the arrangement of the superconductivity solenoid coil 11 and the saddle coil 12.

Figure 2A:
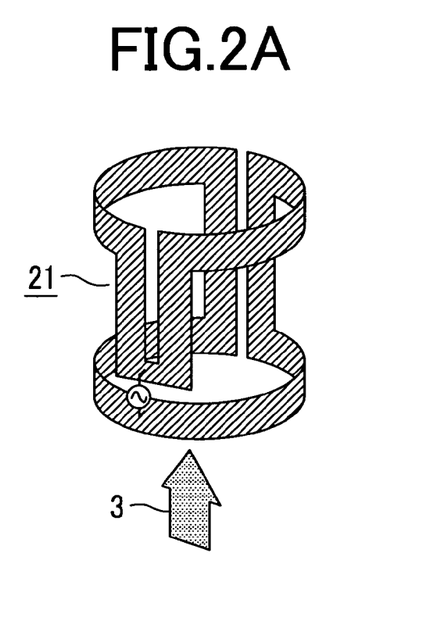
FIG. 2A is a perspective view showing a superconductivity saddle coil according to a conventional vertical NMR system.
Figure 2B:
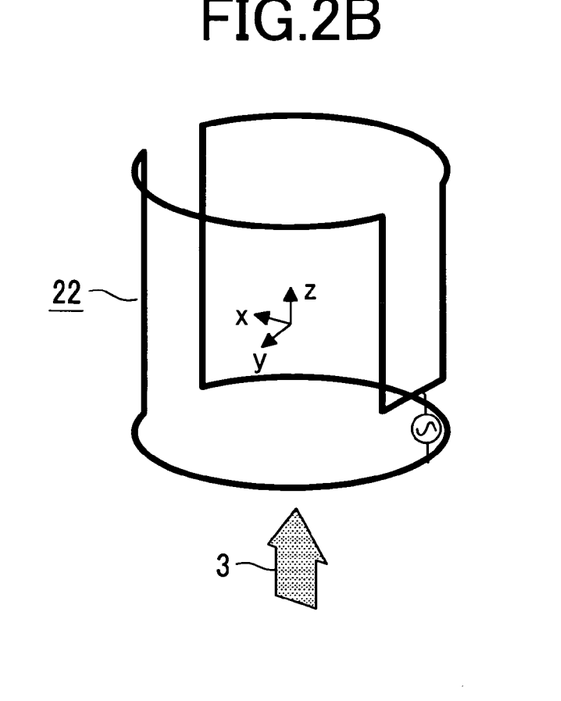
FIG. 2B is a perspective view showing a saddle coil according to the conventional vertical NMR system.
Figure 2C:
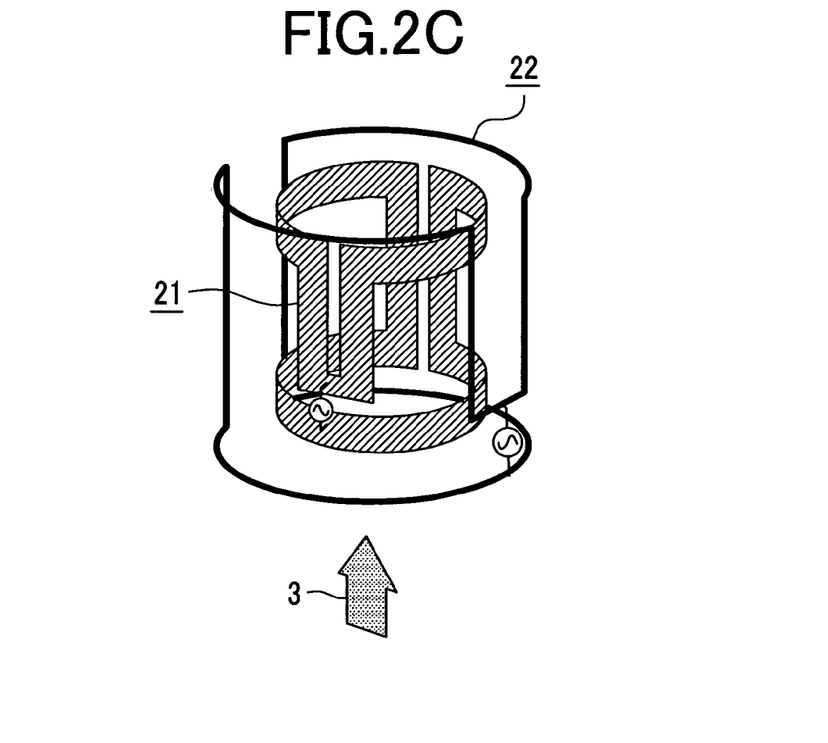
FIG. 2C is a perspective view showing the arrangement of the superconductivity saddle coil and the saddle coil according to the conventional vertical NMR system.

FIGS. 2A to 2C show a conventional vertical NMR system, in which FIG. 2A is a perspective view of a superconductivity solenoid coil 21, FIG. 2B is a perspective view of a saddle coil 22, and FIG. 2C is a perspective view showing the arrangement of the superconductivity solenoid coil 21 and the saddle coil 22.

In the horizontal NMR system whose static magnetic field direction 3 is horizontal, the solenoid coil 11 shown in FIG. 1A is used as a reception probe coil. In the vertical NMR system whose static magnetic field direction 3 is vertical, the saddle coil 21 shown in FIG. 2A is used as the reception probe coil.

In the case where the probe coil is made of normal metal, there are many cases in which the probe coil transmits and receives the high frequency magnetic field.

On the other hand, in the case where the probe coil is formed of a superconductivity thin film, there are many cases in which the probe coil is used for only receiving the high frequency magnetic field since the superconductivity thin film does not withstand a large high-frequency current. In this case, a saddle coil is disposed outside of the probe coil for transmission of the high frequency magnetic field.

From the above-mentioned restrictions, in the horizontal NMR system, the reception probe coil 11 and the transmission probe coil 12 are arranged as shown in FIG. 1C. In the vertical NMR system, the reception probe coil 21 and the transmission probe coil 22 are arranged as shown in FIG. 2C. In order to prevent the reception coil from electromagnetically interfering with the transmission coil, it is necessary to dispose the probe coil so that the high frequency magnetic fields that are developed in the centers of the respective reception coil and transmission coil when electricity is fed to those coils are orthogonal to each other.

SUMMARY OF THE INVENTION

The MNR measurement conducts multiplex resonance that generates a plurality of frequencies at the same time and measures the resonance of a plurality of nuclears. There are many cases in which nuclear species of 1H, 2H, 13C, 15N or the like are measured. The resonance frequencies of the respective nuclear species are different from each other. For example, when a static magnetic field intensity is 14.1 tesla, a resonance frequency of 1H is about 600 MHz, a resonance frequency of 2H is about 92.1 MHz, a resonance frequency of 13C is about 150.9 MHz, and a resonance frequency of 15N is about 60.8 MHz. In order to deal with two kinds of frequencies by one coil, two tuning circuits are incorporated to conduct double tunings. The double tunings generally deteriorate the performance by about 20 to 30%. In principle, it is possible to incorporate three tuning circuits for triple tunings. However, when the frequencies of the nuclear species are in proximity to each other, each other's frequencies cannot be cut off, thereby making it hard to implement triple tunings. For example, the resonance frequencies of 2H and 15N are in proximity to each other, and it is difficult to cut off each other's frequencies.

When only one transmission coil is provided, it is difficult to transmit a frequency of 1H, a frequency of 15N, and a frequency of 2H by the identical saddle coil. Therefore, there arises such a problem that this structure cannot deal with, for example, a measurement sequence in which while the frequency of 15N continues to be transmitted, a frequency lock is conducted, and a frequency of 1H is received.

The present invention has been made to solve the above problem, and therefore an object of the present invention is to provide a nuclear magnetic resonance system that is capable of conducting multiplex resonance measurement without largely deteriorating the sensitivities of a superconductivity reception coil and a transmission coil.

If another coil that is electromagnetically orthogonal to the reception coil can be prepared, such a structure can deal with the above-mentioned measurement sequence. However, it is necessary that a high frequency magnetic field that is developed in the center of the coil when electricity is fed to the coil is so disposed as to be orthogonal to the static magnetic field as described above. Also, in order to prevent an electromagnetic interference with each other, it is necessary that the probe coils are arranged such that high frequency magnetic fields that are developed in the center of the coils when electricity is fed to the respective coils are orthogonal to each other. The probe coil arrangement that satisfies the above restriction has not yet been known.

Under the above circumstances, to achieve the above object, the nuclear, magnetic resonance (NMR) system according to the present invention conducts multiplex resonance measurement intended for three or more kinds of nuclear species with the following structure. That is, the nuclear magnetic resonance system is made up of a superconductivity reception coil, a transmitting coil and four electric current loops, and also includes a coil (hereinafter referred to as "additional coil" (or a self-shield coil) in which directions of currents that flow in an inner loop and an outer loop are opposite to each other) as a basic structure. An arrangement is made that a direction of a high frequency magnetic field that is developed in the center of the additional coil when electricity is fed to the additional coil is substantially identical with a direction of a high frequency magnetic field that is developed in the center of the transmission coil when electricity is fed to the transmission coil. Also, a current loop of the transmission coil is arranged between the inner loop and the outer loop of the additional coil, desirably substantially in the middle therebetween.

Hereinafter, a structure of the NMR system according to the present invention will be described in more detail.

In a first structure of the NMR system according to the present invention, there are provided a means for generating a substantially uniform magnetic field $B_0$, a probe for transmitting a high frequency signal at a predetermined resonance frequency and/or receiving a free induction decay (FID) signal with respect to a sample within a tubular vessel that is located in the magnetic field $B_0$, and an additional coil that has four electric current loops in which directions of currents that flow in an inner loop and an outer loop are opposite to each other. This structure makes it possible to conduct multiplex resonance measurement intended for three or more kinds of nuclear species.

In the first structure, the transmission coil has two electric current loops where a direction of electric current is the same on those two electric current loops, and the respective two electric current loops of the transmission coil are arranged substantially in the middle of the inner loop and the outer loop of the additional coil.

In the first structure, the transmission coil and the additional coil are arranged in such a manner that a direction of a high frequency magnetic field that is developed in the center of the additional coil when electricity is fed to the additional coil is substantially identical with a direction of a high frequency magnetic field that is developed in the center of the transmission coil when electricity is fed to the transmission coil.

In a second structure of the NMR system according to the present invention, there are provided a superconductivity magnet that develops a substantially uniform static magnetic field in a horizontal direction or a vertical direction, a transmission coil that transmits a high frequency signal at a predetermined resonance frequency with respect to a sample within a tubular vessel that is located in a static magnetic field, a superconductivity reception coil that receives a free induction decay (FID) signal, and an additional coil that has four electric current loops in which directions of electric currents that flow in an inner loop and an outer loop are opposite to each other. The transmission coil has two electric current loops where a direction of electric current is the same on those two electric current loops, and the respective two electric current loops of the transmission coil are arranged substantially in the middle of the inner loop and the outer loop of the additional coil. This structure makes it possible to conduct multiplex resonance measurement intended for three or more kinds of nuclear species.

As a result, the NMR system according to the present invention can conduct multiplex resonance measurement without largely deteriorating the sensitivities of the superconductivity reception coil and the transmission coil.

Hereinafter, specific structural examples of the NMR system according to the present invention will be described.

(1) A nuclear magnetic resonance system comprising: means for generating a substantially uniform magnetic field; a transmission coil for transmitting a high frequency signal at a predetermined resonance frequency with respect to a sample within a tubular vessel that is located in the magnetic field; a reception coil for receiving a free induction decay signal; and an additional coil that has four electric current loops in which directions of currents that flow in an inner loop and an outer loop are opposite to each other, wherein the transmission coil is arranged between the inner loop and the outer loop of the additional coil.

(2) The nuclear magnetic resonance system according to the above item (1), wherein the transmission coil has two electric current loops, where a direction of electric current is the same on the two electric current loops.

(3) The nuclear magnetic resonance system according to the above item (2), wherein the respective two electric current loops of the transmission coil are arranged substantially in the middle of the inner loop and the outer loop of the additional coil.

(4) The nuclear magnetic resonance system according to the above item (1) or (3), wherein a direction of a high frequency magnetic field that is developed in the center of the additional coil when electricity is fed to the additional coil is substantially identical with a direction of a high frequency magnetic field that is developed in the center of the transmission coil when electricity is fed to the transmission coil.

(5) A nuclear magnetic resonance system comprising: means for generating a substantially uniform magnetic field; a probe coil for transmitting a high frequency signal at a predetermined resonance frequency and/or receiving a free induction decay signal with respect to a sample within a tubular vessel that is located in the magnetic field; and an additional coil that has four electric current loops in which directions of currents that flow in an inner loop and an outer loop are opposite to each other, wherein the probe coil is arranged between the inner loop and the outer loop of the additional coil.

(6) The nuclear magnetic resonance system according to the above item (5), wherein the probe coil has two electric current loops where a direction of electric current is the same on the two electric current loops, and the respective two electric current loops of the probe coil are arranged substantially in the middle of the inner loop and the outer loop of the additional coil.

(7) The nuclear magnetic resonance system according to the above item (5) or (6), wherein a direction of a high frequency magnetic field that is developed in the center of the additional coil when electricity is fed to the additional coil is substantially identical with a direction of a high frequency magnetic field that is developed in the center of the probe coil when electricity is fed to the probe coil.

(8) A nuclear magnetic resonance system comprising: a superconductivity magnet that develops a substantially uniform static magnetic field in a horizontal direction or a vertical direction; a transmission coil that transmits a high frequency signal at a predetermined resonance frequency with respect to a sample within a tubular vessel that is located in a static magnetic field; a superconductivity reception coil that receives a free induction decay signal; and an additional coil that has four electric current loops in which directions of electric currents that flow in an inner loop and an outer loop are opposite to each other, wherein the transmission coil has two electric current loops where a direction of electric current is the same on the two electric current loops, and the respective two electric current loops of the transmission coil are arranged substantially in the middle of the inner loop and the outer loop of the additional coil.

(9) The nuclear magnetic resonance system according to the above item (8) wherein a direction of a high frequency magnetic field that is developed in the center of the additional coil when electricity is fed to the additional coil is substantially identical with a direction of a high frequency magnetic field that is developed in the center of the transmission coil when electricity is fed to the transmission coil.

According to the present invention, there can be realized a nuclear magnetic resonance system that can conduct multiplex resonance measurement intended for three or more kinds of nuclear species without largely deteriorating the sensitivities of the superconductivity reception coil and the transmission coil.

DETAILED DESCRIPTION OF THE PREFERRED EMBODIMENTS

The present invention relates to a coil configuration of a probe for transmitting a high frequency signal at a predetermined resonance frequency and receiving a free induction decay (FID) signal with respect to a sample that is located in a uniform magnetic field $B_0$, and a structure for mounting the probe, in a nuclear magnetic resonance (NMR) system.

The present invention is applied to an NMR system (horizontal NMR system) using a superconductivity magnet that develops a static magnetic field in a horizontal direction as shown in FIGS. 1A to 1C, and an NMR system (vertical NMR system) using a superconductivity magnet that develops a static magnetic field in a vertical direction as shown in FIGS. 2A to 2C.

The present invention can conduct multiplex resonance measurement by using another coil (additional coil) without largely deteriorating the sensitivities of the superconductivity reception coil and the transmission coil in a nuclear magnetic resonance (NMR) spectroscopy.

Hereinafter, embodiments of the present invention will be described in more detail with reference to the accompanying drawings.

Figure 3A:
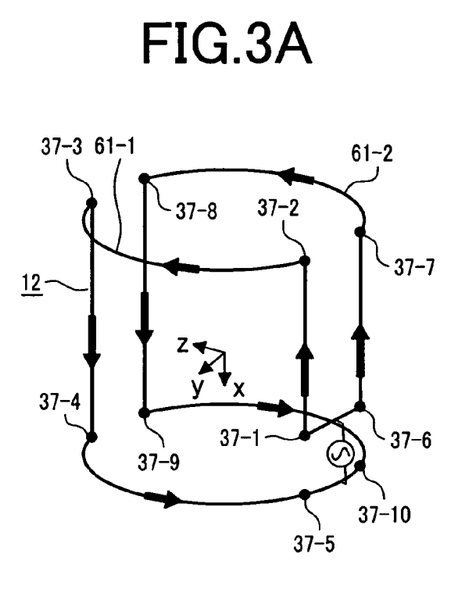
FIG. 3A is a perspective view showing a saddle coil according to a comparative example of the present invention.

First, a process until the present invention has been achieved will be described. FIG. 3A is a perspective view showing a saddle coil (first saddle coil) 12, FIG. 3B is a perspective view showing a second saddle coil 31, FIG. 3C is a graph showing a sensitivity distribution of the saddle coil (first saddle coil) 12, and FIG. 3D is a graph showing a sensitivity distribution of the second saddle coil 31.

Figure 3B:
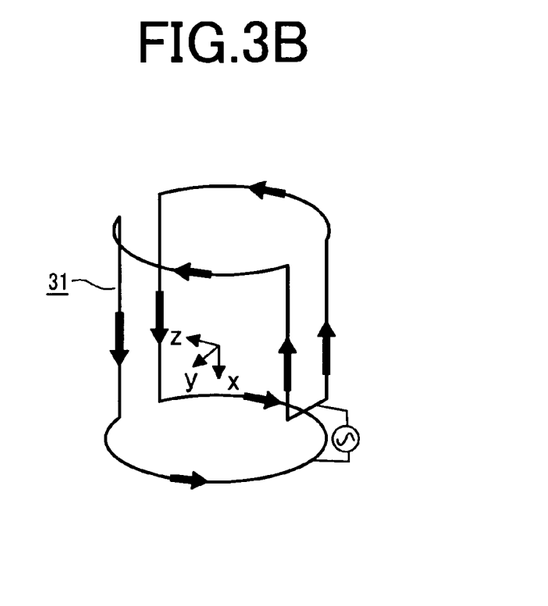
FIG. 3B is a perspective view showing a second saddle coil according to the comparative example of the present invention.
Figure 3C:
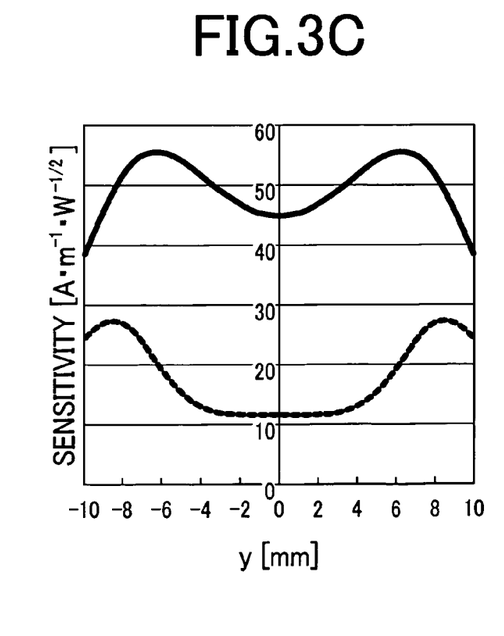
FIG. 3C is a graph showing a sensitivity distribution of the saddle coil according to the comparative example of the present invention.
Figure 3D:
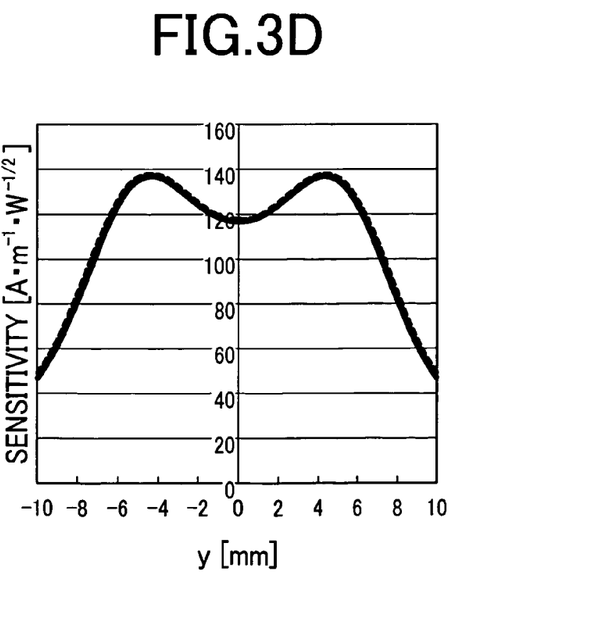
FIG. 3D is a graph showing a sensitivity distribution of the second saddle coil according to the comparative example of the present invention.

In the case where the second saddle coil 31 shown in FIG. 3B is additionally disposed inside of the saddle coil (first saddle coil) 12 shown in FIG. 3A, the second saddle coil 31 and the saddle coil (first saddle coil) 12 are electromagnetically coupled with each other, thereby deteriorating the sensitivity. This phenomenon is exhibited through a computer simulation. Bold arrows shown in FIGS. 3A and 3B indicate directions along which electric currents flow.

For description of the coil configuration, nodes 37-1 to 37-10 are shown in FIG. 3A. For example, a conductor 61-1 is a conductor that connects a node 37-2 and a node 37-3 with a curve, and a conductor 61-2 is a conductor that connects a node 37-7 and a node 37-8 with a curve. A node 37-1 and a node 37-6 are symmetrically positioned with respect to the x-z plane. Likewise, the node 37-2 and the node 37-7 are symmetrically positioned with respect to the x-z plane. Also, the node 37-3 and the node 37-8 are symmetrically positioned with respect to the x-z plane. Further, a node 37-4 and a node 37-9 are symmetrically positioned with respect to the x-z plane. Still further, a node 37-5 and a node 37-10 are symmetrically positioned with respect to the x-z plane.

A conductor route that functions as one loop such as a conductor route that connects the nodes 37-1, 37-2, 37-3, 37-4 and 37-5 is called "electric current loop" in the present specification. Similarly, a conductor route that connects the nodes 37-6, 37-7, 37-8, 37-9 and 37-10 is an electric current loop. Thus, the saddle coil 12 has two electric current loops. Those two electric current loops are symmetrically positioned with respect to the x-z plane, and a direction of electric current is the same on those two electric current loops. Therefore, the high frequency magnetic field that is developed in the center of the saddle coil 12 when electricity is fed to the saddle coil 12 is in the y-direction.

In a calculation mode, the second saddle 31 has tuned in to a frequency (92.1 MHz) of 2H nuclear species is disposed inside of the saddle coil 12 that tuned in to a frequency (600 MHz) of 1H nuclear species in the static magnetic field intensity 14.1 tesla. The second saddle 31 also has two electric current loops as with the saddle coil 12 although the dimensions are different from those of the saddle coil 12. The high frequency magnetic field that is developed in the center of the second saddle coil 31 when electricity is fed to the second saddle coil 31 is in the y-direction.

FIG. 3C shows the sensitivity distribution of the saddle coil (first saddle coil) 12 on the y-axis at 600 MHz. FIG. 3D shows the sensitivity distribution of the second saddle coil 31 on the y-axis at 92.1 MHz.

In FIG. 3C, a solid line indicates the sensitivity distribution in the case where only the saddle coil (first saddle coil) 12 exists, and a dotted line indicates the sensitivity distribution in the case where the second saddle coil 31 exists inside of the saddle coil 12. It is understood from FIG. 3C that the existence of the second saddle coil 31 deteriorates the center sensitivity of the saddle coil (first saddle coil) 12 down to about ¼.

In FIG. 3D, a solid line indicates the sensitivity distribution in the case where only the second saddle coil 31 exists, and a dotted line indicates the sensitivity distribution in the case where the saddle coil (first saddle coil) 12 exists outside of the second saddle coil 31. It is understood from FIG. 3D that the solid line and the dotted line are substantially superimposed on each other, and the sensitivity of the second saddle coil 31 hardly changes regardless of the presence or absence of the arrangement of the saddle coil (first saddle coil) 12 outside thereof. The fact that the additional provision of another coil (second saddle coil 31) largely deteriorates the sensitivity of the first transmission coil (saddle coil (first saddle coil) 12) is remarkably disadvantageous in the NMR measurement.

As described above, the simple additional provision of another coil deteriorates the performance as shown in FIG. 3C. For that reason, it is understood that there is required the additional coil according to the present invention which does not deteriorate the performance of the transmission coil.

First Embodiment

Now, a description will be given of a structure by which another coil (additional coil) can be arranged which does not largely deteriorate the sensitivities of other coils and itself in order to conduct multiplex resonance.

Figure 4:
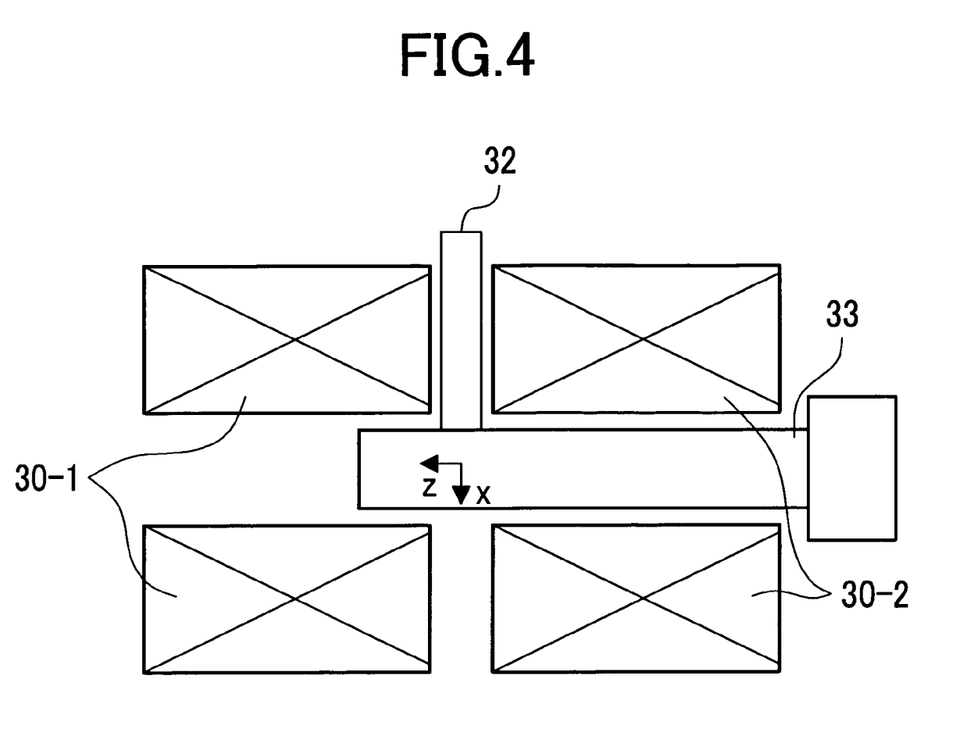
FIG. 4 is a schematic diagram showing a structure of an NMR system (horizontal NMR system) according to a first embodiment of the present invention.

FIG. 4 is a schematic diagram showing a structure of an NMR system (horizontal NMR system) according to a first embodiment of the present invention.

Two divided superconductivity magnets 30-1 and 30-2 develop a uniform magnetic field $B_0$ of 14.1 tesla (T). The static magnetic field is in the z-direction. A low-temperature probe 33 that can cool the probe coil down to 10 K is located within the static magnetic field. A glass tube 32 having an inner diameter of 5 mm into which a sample is disposed is inserted into a thermally insulated inner side of the low-temperature probe. The sample tube into which the sample to be measured is disposed is inserted vertically into the lower-temperature probe.

The solenoid coil 11 shown in FIG. 1A is employed as a 1H reception probe coil. The direction of the high frequency magnetic field that is developed in the center of the solenoid coil 11 when electricity is fed to the coil 11 is defined as an x-direction. The resonance frequency of the solenoid coil 11 tunes in to the resonance frequency 600 MHz of 1H at the static magnetic field intensity 14.1 tesla. The solenoid coil 11 is formed of a superconductivity thin film and used for only the reception coil.

Figure 5A:
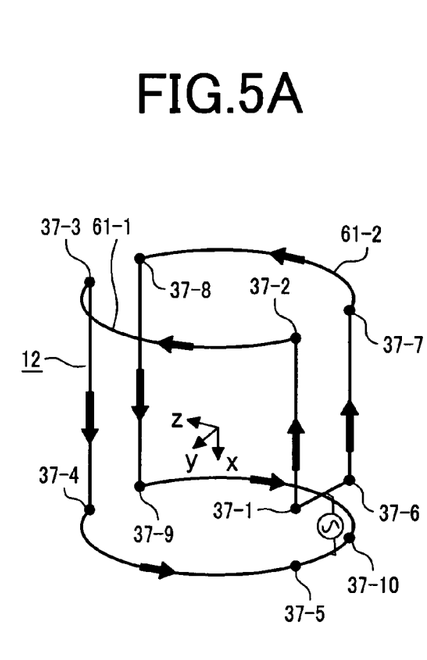
FIG. 5A is a perspective view showing a saddle coil according to the first embodiment of the present invention.
Figure 5B:
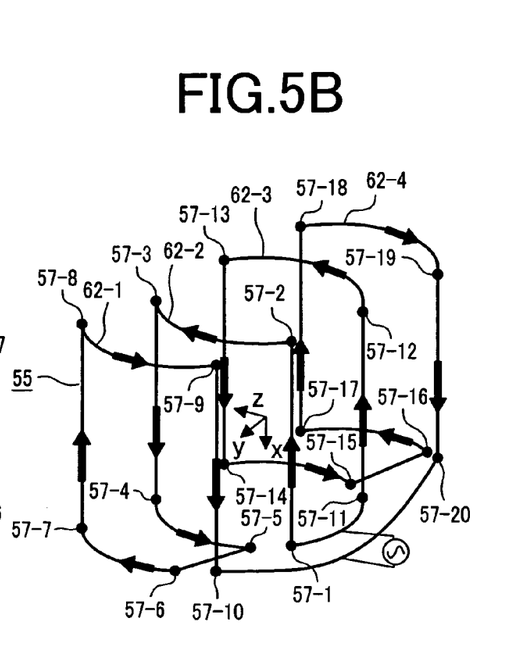
FIG. 5B is a perspective view showing an additional coil according to the first embodiment of the present invention.
Figure 5C:
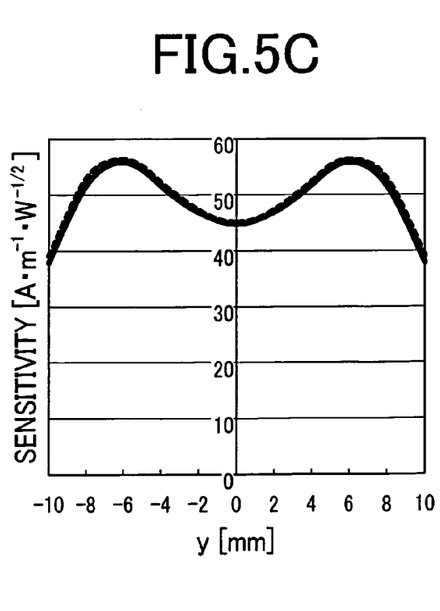
FIG. 5C is a graph showing a sensitivity distribution of the saddle coil according to the first embodiment of the present invention.
Figure 5D:
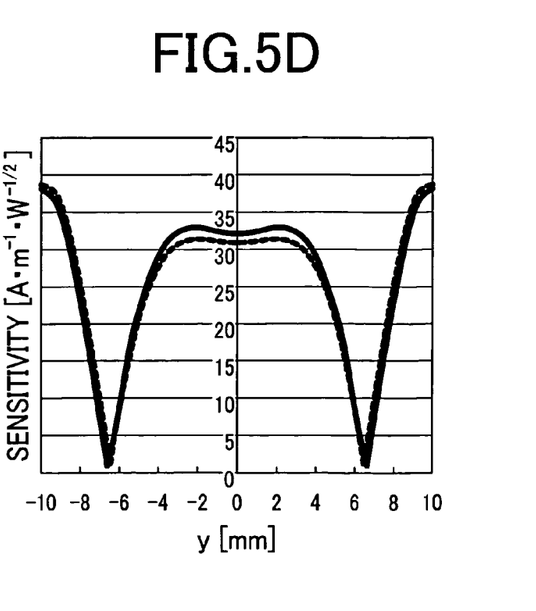
FIG. 5D is a graph showing a sensitivity distribution of the coil shown in FIG. 5B according to the first embodiment of the present invention.

FIG. 5A is a perspective view showing the saddle coil 12 in the NMR system according to this embodiment. FIG. 5B is a perspective view showing a coil (additional coil) 55 which has four electric current loops in which directions of electric currents that flow in the inner loop and the outer loop are opposite to each other in the NMR system according to this embodiment. FIG. 5C is a graph showing a sensitivity distribution of the saddle coil in the NMR system according to this embodiment. FIG. 5D is a graph showing a sensitivity distribution of the coil shown in FIG. 5B in the NMR system according to this embodiment. Bold arrows shown in FIGS. 5A and 5B indicate directions along which the current flow.

The saddle coil 12 shown in FIG. 5A is employed as the transmission coil. The saddle coil 12 has two electric current loops in which a direction of electric current is the same on the two loops. The high frequency magnetic fields that are developed by those two electric current loops are in the y-direction in the center of the coil. The directions of the high frequency magnetic fields that are developed in the centers of the solenoid coil 11 and the saddle coil 12 when electricity is fed to the respective coils are orthogonal to each other, and also orthogonal to the static magnetic field (z-direction). Because the directions of the high frequency magnetic fields that are developed in the centers of the respective coils are orthogonal to each other, there is no electromagnetic coupling between those high frequency magnetic fields.

The saddle coil 12 doubly tunes in to the resonance frequency 600 MHz of 1H and the resonance frequency 60.8 MHz of 15N at the static magnetic field intensity 14.1 tesla. The saddle coil 12 may be used only for transmission or commonly for transmission and reception. For example, the reception of 15N can be performed by means of the saddle coil 12.

The coil 55 shown in FIG. 5B is employed as the additional coil. The coil 55 has four electric current loops in which directions of electric currents that flow in the inner loop and the outer loop are opposite to each other. The coil 55 tunes in to the resonance frequency 92.1 MHz of 2H. The coil 55 conducts transmission and reception of 2H.

For description of the configuration of the coil 55 shown in FIG. 5B, nodes 57-1 to 57-20 are indicated in FIG. 5B. For example, a conductor 62-1 is a conductor that connects a node 57-8 and a node 57-9 with a curve, and a conductor 62-2 is a conductor that connects a node 57-2 and a node 57-3 with a curve. Also, a conductor 62-3 is a conductor that connects a node 57-12 and a node 57-13 with a curve, and a conductor 62-4 is a conductor that connects a node 57-18 and a node 57-19 with a curve. A node 57-1 and a node 57-11 are symmetrically positioned on the x-z plane. Similarly, the node 57-2 and a node 57-12 are symmetrically positioned on the x-z plane. Also, the node 57-3 and a node 57-13 are symmetrically positioned on the x-z plane. Similarly, the node 57-4 and a node 57-14 are symmetrically positioned on the x-z plane. Similarly, the node 57-5 and a node 57-15 are symmetrically positioned on the x-z plane. Similarly, the node 57-6 and a node 57-16 are symmetrically positioned on the x-z plane. Similarly, the node 57-7 and a node 57-17 are symmetrically positioned on the x-z plane. Similarly, the node 57-8 and a node 57-18 are symmetrically positioned on the x-z plane. Similarly, the node 57-9 and a node 57-19 are symmetrically positioned on the x-z plane. Similarly, the node 57-10 and a node 57-20 are symmetrically positioned on the x-z plane.

A conductor route that connects the nodes 57-1, 57-2, 57-3, 57-4 and 57-5 composes an electric current loop. Similarly, a conductor route that connects the nodes 57-6, 57-7, 57-8, 57-9 and 57-10 composes an electric current loop. Similarly, a conductor route that connects the nodes 57-11, 57-12, 57-13, 57-14 and 57-15 composes an electric current loop. Similarly, a conductor route that connects the nodes 57-16, 57-17, 57-18, 57-19 and 57-20 composes an electric current loop. That is, the coil 55 shown in FIG. 5B has four electric current loops.

Among those four electric current loops, the current loop (conductor route) that connects the nodes 57-1, 57-2, 57-3, 57-4 and 57-5, and the current loop (conductor route) that connects the nodes 57-11, 57-12, 57-13, 57-14 and 57-15 are called "inner loop" in the present specification. Also, the current loop (conductor route) that connects the nodes 57-6, 57-7, 57-8, 57-9 and 57-10, and the current loop (conductor route) that connects the nodes 57-16, 57-17, 57-18, 57-19 and 57-20 are called "outer loop" in the present specification. Those two inner loops are symmetrically positioned with respect to the x-z plane, and a direction of electric current is the same on the two inner loops. Therefore, the high frequency magnetic fields that are developed in the center (origin) of the coils by the electric current on those two inner loops are in the y-direction.

Those two outer loops are symmetrically positioned with respect to the x-z plane, a direction of electric current is the same on the two outer loops, and the direction of electric current flowing on the outer loop is opposite to the direction of electric current flowing on the inner loop. Therefore, the high frequency magnetic fields that are developed in the center of the coils by the electric current on those two outer loops are in the -y-direction.

A distance between the inner loops and the origin is shorter than a distance between the outer loops and the origin. For that reason, the high frequency magnetic field that is developed in the center of the coil 55 shown in FIG. 5B when electricity is fed to the coil 55 is in the y direction. Therefore, the high frequency magnetic field developed by the coil 55 is electromagnetically orthogonal to that by the solenoid coil 11, and there is no electromagnetic coupling between those high frequency magnetic fields. The high frequency magnetic fields that are developed when electricity is fed to the coil 55 and the saddle coil 12 shown in FIG. 5B are in the y-direction in the center of those coils. However, even if the coil shown in FIG. 5B is added, the sensitivities of the saddle coil 12 and the additional coil are not largely deteriorated.

FIG. 5C shows a sensitivity distribution of the saddle coil 12 on the y axis. FIG. 5D shows a sensitivity distribution of the coil 55 shown in FIG. 5B on the y-axis.

In FIG. 5C, a solid line indicates the sensitivity distribution in the case where only the saddle coil 12 exists, and a dotted line indicates the sensitivity distribution in the case where the coil 55 shown in FIG. 5B exists together with the saddle coil 12. It is understood from FIG. 5C that the solid line and the dotted line are substantially superimposed on each other, and the sensitivity of the saddle coil 12 hardly changes regardless of the presence or absence of the arrangement of the coil 55 shown in FIG. 5B.

In FIG. 5D, a solid line indicates the sensitivity distribution in the case where only the coil 55 shown in FIG. 5B exists, and a dotted line indicates the sensitivity distribution in the case where the coil 55 exists together with the saddle coil 12. The sensitivity in the case where the saddle coil 12 exists together is more deteriorated by about several %. However, it is understood from FIG. 5D that the solid line and the dotted line are substantially superimposed on each other, and the sensitivity of the coil 55 shown in FIG. 5B does not largely change regardless of the presence or absence of the arrangement of the saddle coil 12.

Even if the coil shown in FIG. 5B is added, the sensitivities of the other coil and the coil 55 are not largely deteriorated. Therefore, multiplex resonance can be performed with respect to three or more kinds of nuclear species. For example, there can be implemented a measurement sequence in which while the frequency of 15N continues to be transmitted by means of the saddle coil 12, a frequency lock is conducted at 2H by means of the coil 55 shown in FIG. 5B, and a reception of 1H is conducted by means of the solenoid coil 11.

Figure 6:
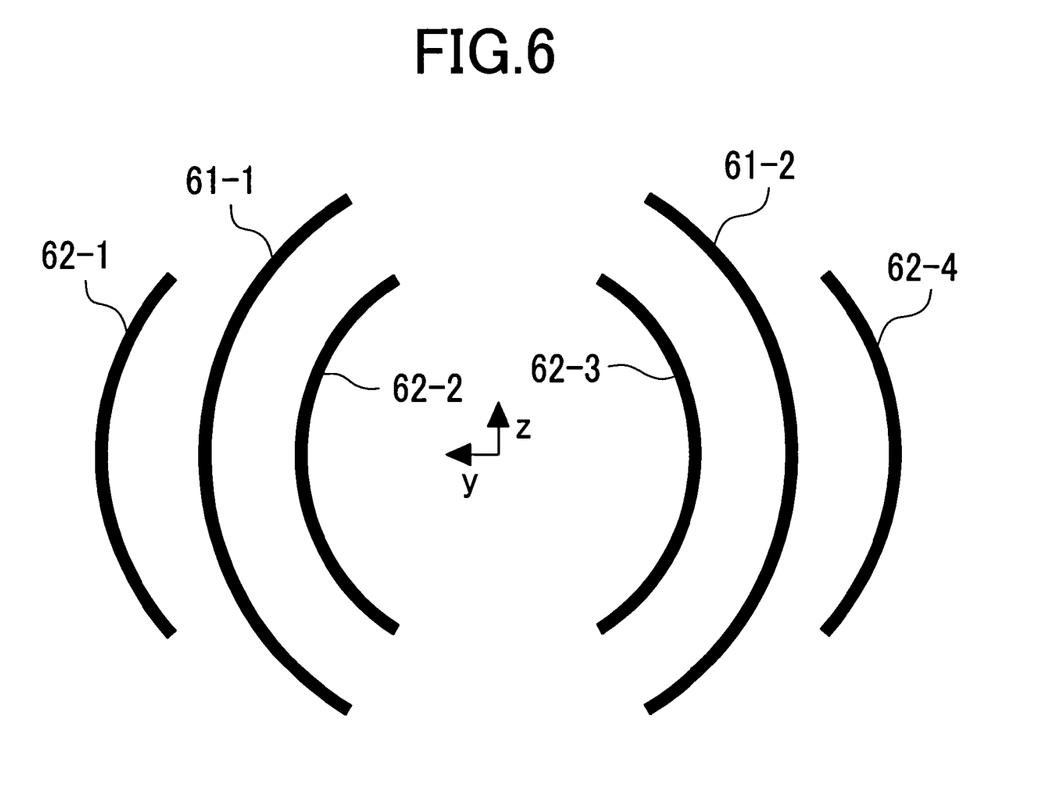
FIG. 6 is a diagram showing an arrangement of conductors on a plane (y-z plane) that is orthogonal to a vertical direction of the two coils when viewing the saddle coil and the coil shown in FIG. 5B from the vertical direction.

FIG. 6 is a diagram showing an arrangement of conductors on a plane (y-z plane) that is orthogonal to a vertical direction of the saddle coil 12 and the coil 55 shown in FIG. 5B when viewing those two coils from the vertical direction.

Reference 61-1 and 61-2 denotes conductors that constitute the saddle coil 12, and reference 62-1, 62-2, 62-3 and 62-4 denotes conductors that constitute the coils 55 shown in FIG. 5B. In order to reduce the electromagnetic coupling of those two coils, it is necessary that the conductor 61-1 is disposed between the conductor 62-1 and the conductor 62-2, and the conductor 61-2 is disposed between the conductor 62-3 and the conductor 62-4. Also, in order to most reduce the electromagnetic coupling of those two coils, the conductor 61-1 is disposed in the middle of the conductor 62-1 and the conductor 62-2, and the conductor 61-2 is disposed in the middle of the conductor 62-3 and the conductor 62-4.

Second Embodiment

Figure 7:
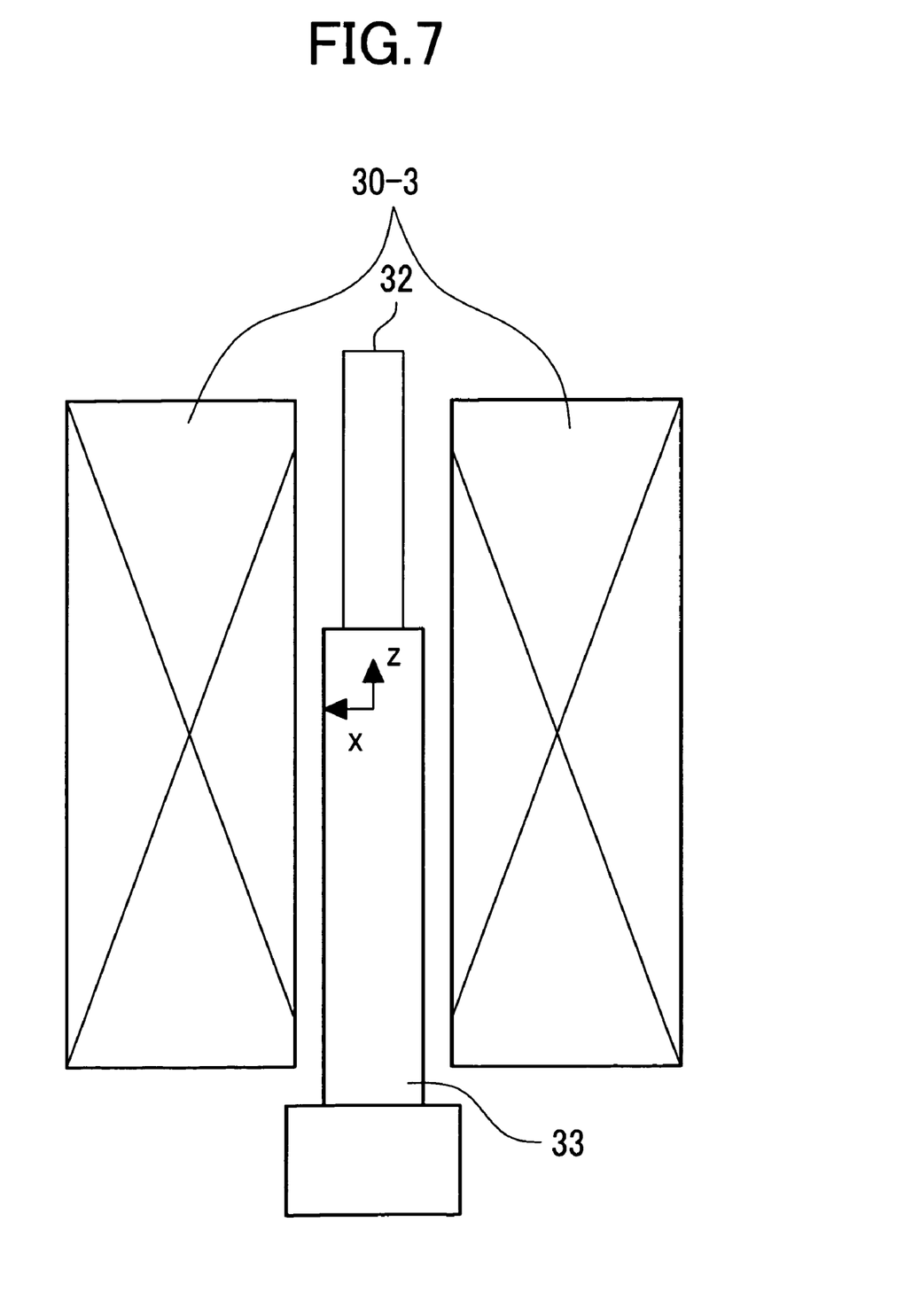
FIG. 7 is a schematic diagram showing a structure of an NMR system (vertical NMR system) according to a second embodiment of the present invention.

FIG. 7 is a schematic diagram showing a structure of an NMR system (vertical NMR system) according to a second embodiment of the present invention.

A uniform magnetic field $B_0$ of 14.1 tesla (T) is developed vertically by a superconductivity magnet 30-3. It is assumed that the direction of the static magnetic field is a z-direction. A low-temperature probe 33 that can cool the probe coil down to 10 K is located within the static magnetic field. A glass tube 32 having an inner diameter of 5 mm into which a sample is disposed is inserted into a thermally insulated inner side of the low-temperature probe. The sample tube into which the sample to be measured is disposed is inserted vertically into the lower-temperature probe. The solenoid coil 21 shown in FIG. 2A is employed as a 1H reception probe coil. The direction of the high frequency magnetic field that is developed in the center of the reception probe coil 21 when electricity is fed to the coil 21 is defined as an x-direction. The resonance frequency of the reception probe coil 21 tunes in to the resonance frequency 600 MHz of 1H at the static magnetic field intensity 14.1 tesla. The reception probe coil 21 is formed of a superconductivity thin film and used for only the reception coil.

Figure 8A:
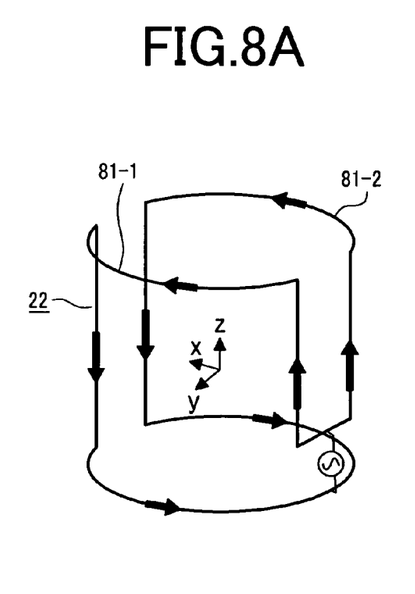
FIG. 8A is a perspective view showing a saddle coil according to the second embodiment of the present invention.
Figure 8B:
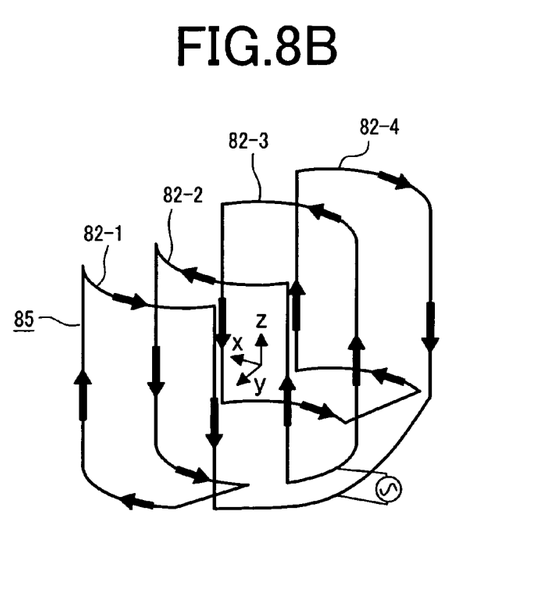
FIG. 8B is a perspective view showing an additional coil according to the second embodiment of the present invention.
Figure 8C:
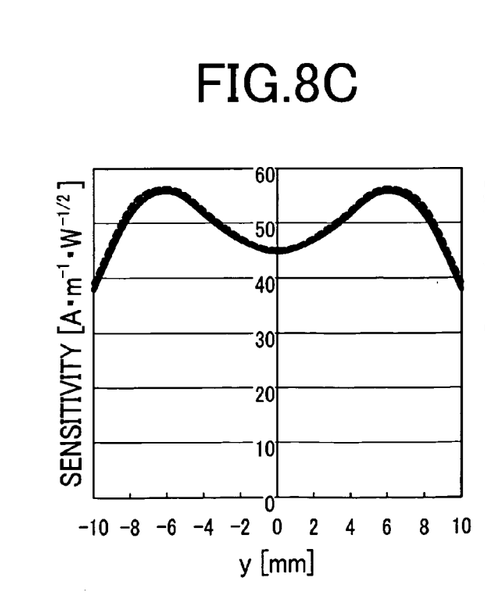
FIG. 8C is a graph showing a sensitivity distribution of the saddle coil according to the second embodiment of the present invention.
Figure 8D:
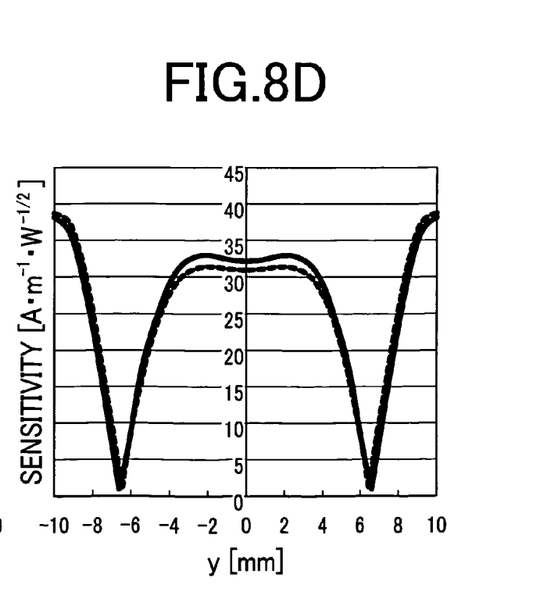
FIG. 8D is a graph showing a sensitivity distribution of the coil shown in FIG. 8B according to the second embodiment of the present invention.

FIG. 8A is a perspective view showing the saddle coil 22 in the NMR system according to this embodiment. FIG. 8B is a perspective view showing a coil (additional coil) 85 which has four electric current loops in which directions of electric currents that flow in the inner loop and the outer loop are opposite to each other in the NMR system according to this embodiment. FIG. 8C is a graph showing a sensitivity distribution of the saddle coil 22 in the NMR system according to this embodiment. FIG. 8D is a graph showing a sensitivity distribution of the coil 85 shown in FIG. 8B in the NMR system according to this embodiment. Bold arrows shown in FIGS. 8A and 8B indicate directions along which the current flow.

The saddle coil 22 shown in FIG. 8A is employed as the transmission coil. The saddle coil 22 has two electric current loops (conductor routes) 81-1 and 81-2 in which a direction of electric current is the same on the two loops 81-1 and 81-2. The directions of the high frequency magnetic fields that are developed by those two electric current loops are the y-direction in the center of the coil. The directions of the high frequency magnetic fields that are developed in the centers of the reception probe coil 21 and the saddle coil 22 when electricity is fed to the respective coils are orthogonal to each other, and also orthogonal to the static magnetic field (z-direction). Because the directions of the high frequency magnetic fields that are developed in the centers of the respective coils are orthogonal to each other, there is no electromagnetic coupling between those high frequency magnetic fields.

The saddle coil 22 doubly tunes in to the resonance frequency 600 MHz of 1H and the resonance frequency 60.8 MHz of 15N at the static magnetic field intensity 14.1 tesla. The saddle coil 22 may be used only for transmission or commonly for transmission and reception. For example, the reception of 15N can be performed by means of the saddle coil 22.

The coil 85 shown in FIG. 8B is employed as another coil (additional coil). The coil 85 has four electric current loops 82-1, 82-2, 82-3 and 82-4 in which directions of electric currents that flow in the inner loop and the outer loop are opposite to each other. The coil 85 tunes in to the resonance frequency 92.1 MHz of 2H. The direction of the high frequency magnetic field that is developed when electricity is fed to the coil 85 shown in FIG. 8B is the y-direction in the center of the coil. For that reason, the high frequency magnetic field developed by the coil 85 is electromagnetically orthogonal to that by the solenoid coil 21, and there is no electromagnetic coupling between those high frequency magnetic fields. The high frequency magnetic fields that are developed when electricity is fed to the coil 85 and the saddle coil 22 shown in FIG. 8B are in the y-direction in the center of those coils. However, even if the coil 85 shown in FIG. 8B is added, the sensitivities of the saddle coil 22 and the coil 85 are not largely deteriorated.

FIG. 8C shows a sensitivity distribution of the saddle coil 22 on the y-axis. FIG. 8D shows a sensitivity distribution of the coil 85 shown in FIG. 8B on the y-axis.

In FIG. 8C, a solid line indicates the sensitivity distribution in the case where only the saddle coil 22 exists, and a dotted line indicates the sensitivity distribution in the case where the coil 85 shown in FIG. 8B exists together with the saddle coil 22. It is understood from FIG. 8C that the solid line and the dotted line are substantially superimposed on each other, and the sensitivity of the saddle coil 22 hardly changes regardless of the presence or absence of the arrangement of the coil 85 shown in FIG. 8B.

In FIG. 8D, a solid line indicates the sensitivity distribution in the case where only the coil 85 shown in FIG. 8B exists, and a dotted line indicates the sensitivity distribution in the case where the coil 85 exists together with the saddle coil 22. The sensitivity in the case where the saddle coil 22 exists together is more deteriorated by about several %. However, it is understood from FIG. 8D that the solid line and the dotted line are substantially superimposed on each other, and the sensitivity of the coil 85 shown in FIG. 8B does not largely change regardless of the presence or absence of the arrangement of the saddle coil 22.

Even if the coil 85 shown in FIG. 8B is added, the sensitivities of the other coil and the coil 85 are not largely deteriorated. Therefore, multiplex resonance measurement can be performed with respect to three or more kinds of nuclear species. For example, there can be implemented a measurement sequence in which while the frequency of 15N continues to be transmitted by means of the saddle coil 22, a frequency lock is conducted at 2H by means of the coil 85 shown in FIG. 8B, a reception of 1H is conducted by means of the reception probe coil 21.

The specific examples of the present invention are described above. Similarly, in examples other than the above-mentioned examples, multiplex resonance can be measured with respect to three or more kinds of nuclear species by using a coil (additional coil) that has four electric current loops in which directions of electric currents that flow in the inner loop and the outer loop are opposite to each other, in addition to the superconductivity reception coil and the transmission coil. For example, the transmission coil and the additional coil may be configured as shown in FIGS. 9A and 9B.

Third Embodiment

Figure 9A:
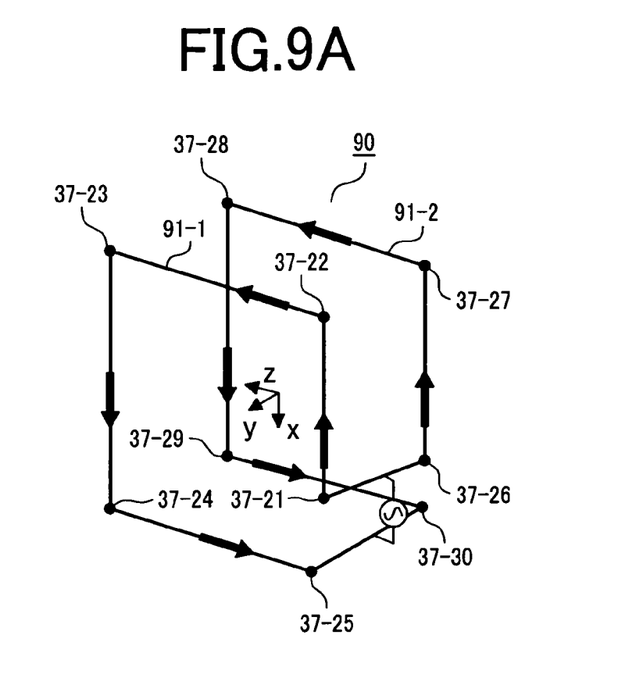
FIG. 9A is a perspective view showing a coil having two electric current loops in which a direction of electric current is the same on the two loops according to a third embodiment of the present invention.
Figure 9B:
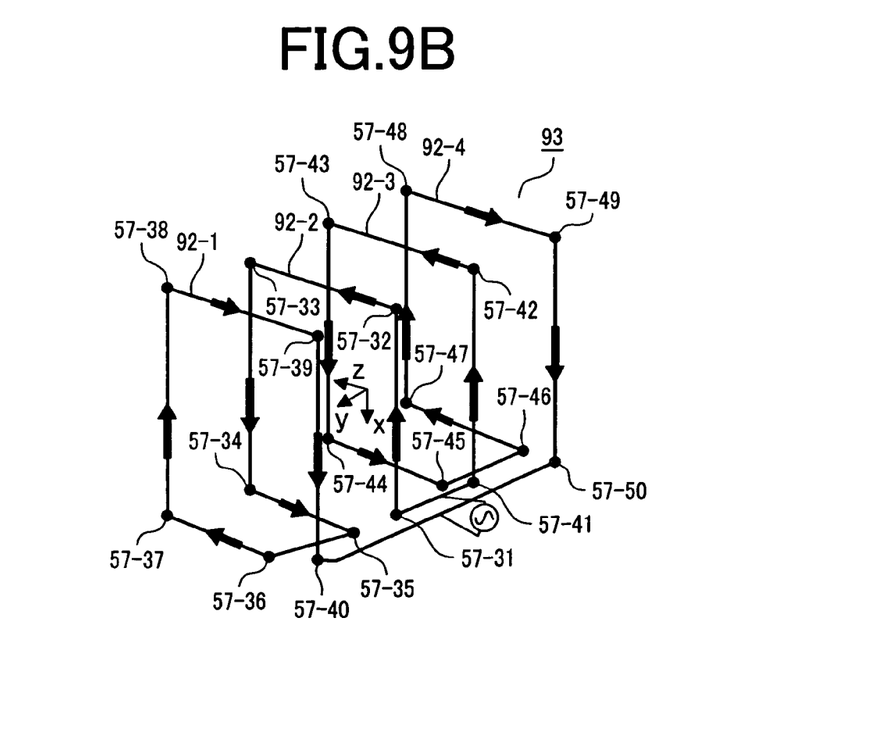
FIG. 9B is a perspective view showing an additional coil according to the third embodiment of the present invention.

FIG. 9A is a perspective view showing a coil 90 that has two electric current loops in which a direction of electric current is the same on the two loops according to a third embodiment of the present invention. FIG. 9B is a perspective view showing a coil (additional coil) 93 which has four electric current loops (conductor routes) in which directions of electric currents that flow in the inner loop and the outer loop are opposite to each other according to the third embodiment of the present invention. Bold arrows shown in FIGS. 9A and 9B indicate directions along which the current flow.

The coil 90 shown in FIG. 9A has two electric current loops in which a direction of electric current is the same on the two loops. The coil 93 shown in FIG. 9B has four electric current loops in which directions of electric currents that flow in the inner loop and the outer loop are opposite to each other.

For description of the configuration of the coil 90, nodes 37-21 to 37-30 are indicated in FIG. 9A. For example, a conductor 91-1 is a conductor that connects a node 37-22 and a node 37-23 with a curve, and a conductor 91-2 is a conductor that connects a node 37-27 and a node 37-28 with a curve. A node 37-21 and a node 37-26 are symmetrically positioned on the x-z plane. Similarly, a node 37-22 and a node 37-27 are symmetrically positioned on the x-z plane. Similarly, a node 37-23 and a node 37-28 are symmetrically positioned on the x-z plane. Similarly, the node 37-24 and a node 37-29 are symmetrically positioned on the x-z plane. Similarly, the node 37-25 and a node 37-30 are symmetrically positioned on the x-z plane.

A conductor route that connects the nodes 37-21, 37-22, 37-23, 37-24 and 37-25 composes one electric current loop. Similarly, a conductor route that connects the nodes 37-26, 37-27, 37-28, 37-29 and 37-30 composes another electric current loop. Thus, the coil 90 has two electric current loops. Those two electric current loops are symmetrically positioned with respect to the x-z plane, and a direction of electric current is the same on the two electric current loops.

For description of the configuration of the coil 93, nodes 57-31 to 57-50 are indicated in FIG. 9B. For example, a conductor 92-1 is a conductor that connects a node 57-38 and a node 57-39 with a curve, and a conductor 92-2 is a conductor that connects a node 57-32 and a node 57-33 with a curve. Also, a conductor 92-3 is a conductor that connects a node 57-42 and a node 57-43 with a curve, and a conductor 92-4 is a conductor that connects a node 57-48 and a node 57-49 with a curve. A node 57-31 and a node 57-41 are symmetrically positioned on the x-z plane. Similarly, the node 57-32 and a node 57-42 are symmetrically positioned on the x-z plane. Similarly, the node 57-33 and a node 57-43 are symmetrically positioned on the x-z plane. Similarly, the node 57-34 and a node 57-44 are symmetrically positioned on the x-z plane. Similarly, the node 57-35 and a node 57-45 are symmetrically positioned on the x-z plane. Similarly, the node 57-36 and a node 57-46 are symmetrically positioned on the x-z plane. Similarly, the node 57-37 and a node 57-47 are symmetrically positioned on the x-z plane. Similarly, the node 57-38 and a node 57-48 are symmetrically positioned on the x-z plane. Similarly, the node 57-39 and a node 57-49 are symmetrically positioned on the x-z plane. Similarly, the node 57-40 and a node 57-50 are symmetrically positioned on the x-z plane.

A conductor route that connects the nodes 57-31, 57-32, 57-33, 57-34 and 57-35 composes an electric current loop. Similarly, a conductor route that connects the nodes 57-36, 57-37, 57-38, 57-39 and 57-40 composes an electric current loop. Similarly, a conductor route that connects the nodes 57-41, 57-42, 57-43, 57-44 and 57-45 composes an electric current loop. Similarly, a conductor route that connects the nodes 57-46, 57-47, 57-48, 57-49 and 57-50 composes an electric current loop. That is, the coil 93 has four electric current loops.

Among those four electric current loops, the electric current loop (conductor route) that connects the nodes 57-31, 57-23, 57-33, 57-34 and 57-35, and the electric current loop (conductor route) that connects the nodes 57-41, 57-42, 57-43, 57-44 and 57-45 are called "inner loop". Also, the electric current loop (conductor route) that connects the nodes 57-36, 57-37, 57-38, 57-39 and 57-40, and the electric current loop (conductor route) that connects the nodes 57-46, 57-47, 57-48, 57-49 and 57-50 are called "outer loop". The direction of electric current on the outer loop is opposite to the direction of electric current on the inner loop.

Figure 10:
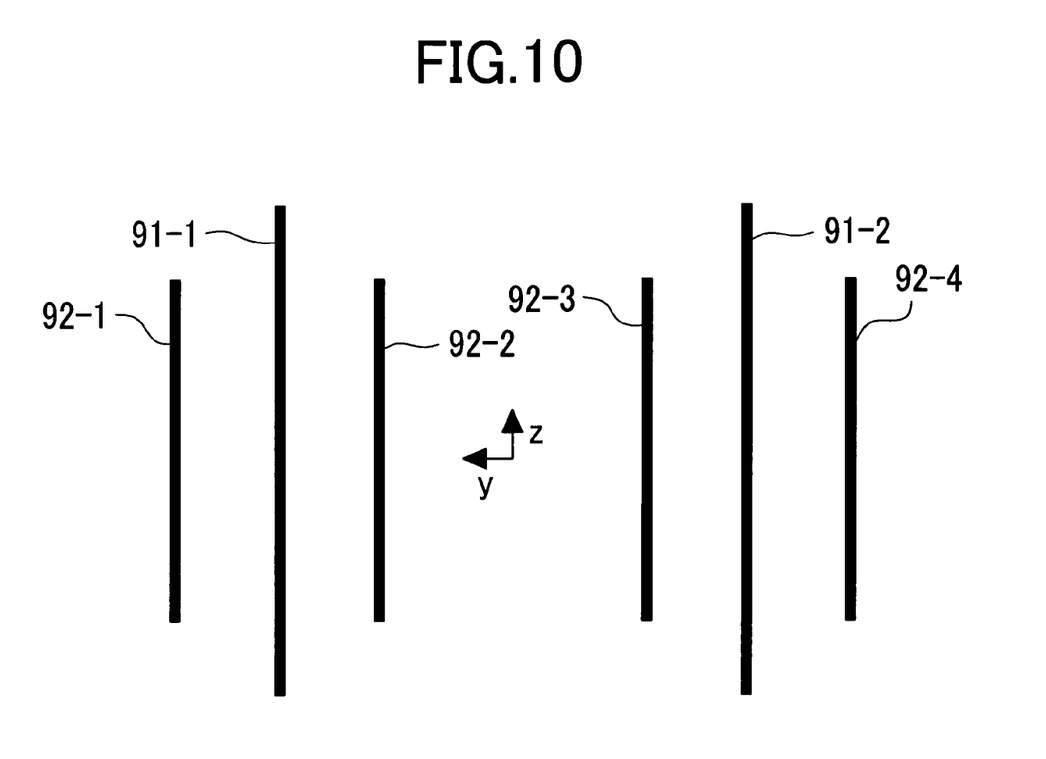
FIG. 10 is a diagram showing an arrangement of conductors on a plane (y-z plane) that is orthogonal to a vertical direction of the coil shown in FIG. 9A and the coil shown in FIG. 9B when viewing those two coils from the vertical direction.

FIG. 10 is a diagram showing an arrangement of conductors on a plane (y-z plane) that is orthogonal to a vertical direction of the coil 90 shown in FIG. 9A and the coil 93 shown in FIG. 9B when viewing those two coils from the vertical direction.

Reference 91-1 and 91-2 denotes conductors that constitute the coil 90 shown in FIG. 9A, and reference 92-1, 92-2, 92-3 and 92-4 denotes conductors that constitute the coils 93 shown in FIG. 9B. The conductor 91-1 is disposed between the conductor 92-1 and the conductor 92-2, and the conductor 91-2 is disposed between the conductor 92-3 and the conductor 92-4.

Also, in order to most reduce the electromagnetic coupling of those two coils 90 and 93, the conductor 91-1 is disposed in the middle of the conductor 92-1 and the conductor 92-2, and the conductor 91-2 is disposed in the middle of the conductor 92-3 and the conductor 92-4.

Also, in a system where the static magnetic field in the vertical direction is developed by the superconductivity magnet, not the saddle coil but a bird cage type coil can be employed as the superconductivity reception probe coil.

Also, it is needless to say that a magnet of a static magnetic field intensity that is different from 14.1 tesla can be used, and nuclear species other than 15N, 2H, 1H and 13C can be measured. The combination of the nuclear species that are dealt with by the saddle coil and the additional coil can be arbitrarily set. For example, the saddle coil doubly tunes in to the resonance frequency of 1H and the resonance frequency of 2H so that the saddle coil can be used for transmission of 1H and for transmission and reception of 2H, and the additional coil can be used for transmission and reception of 15N. Further, the saddle coil doubly tunes in to the resonance frequency of 1H and the resonance frequency of 2H so that the saddle coil can be used for transmission of 1H and for transmission and reception of 2H, and the additional coil doubly tunes in to the resonance frequency of 15H and the resonance frequency of 13C so that the additional coil can be used for transmission of 15N and 13C.

In FIGS. 3C, 3D, 5C, 5D, 8C and 8D, the sensitivity distribution [A m$^{-1}$ W$^{-1/2}$] at the positive and negative positions on the y-axis is exhibited with the center of the coil as y=0. In this description, the sensitivity in the NMR is an electric power that is induced in the coil by magnetization in a unit volume, and the electric power value is equal to a magnetic field intensity that is developed at the respective positions when an electric power of 1 watt is supplied to the coil.

As was described in detail above, according to the present invention, there can be realized a nuclear magnetic resonance system that can conduct multiplex resonance measurement intended for three or more kinds of nuclear species without largely deteriorating the sensitivities of the superconductivity reception coil and the transmission coil.

What is claimed is:

1. A nuclear magnetic resonance system comprising:
    means for generating a substantially uniform magnetic field;
    a transmission coil for transmitting a high frequency signal at a predetermined resonance frequency with respect to a sample within a tubular vessel that is located in the magnetic field;
    a reception coil for receiving a free induction decay signal; and
    an additional coil that has four electric current loops in which directions of currents that flow in an inner loop and an outer loop are opposite to each other,
    wherein the transmission coil is arranged between the inner loop and the outer loop of the additional coil.

2. The nuclear magnetic resonance system according to claim 1, wherein the transmission coil has two electric current loops in which a direction of electric current is the same on the two electric current loops.

3. The nuclear magnetic resonance system according to claim 2, wherein the respective two electric current loops of the transmission coil are arranged substantially in the middle of the inner loop and the outer loop of the additional coil.

4. The nuclear magnetic resonance system according to claim 1 or 3, wherein a direction of a high frequency magnetic field that is developed in the center of the additional coil when electricity is fed to the additional coil is substantially identical with a direction of a high frequency magnetic field that is developed in the center of the transmission coil when electricity is fed to the transmission coil.

5. A nuclear magnetic resonance system comprising:
    a superconductivity magnet that develops a substantially uniform static magnetic field in a horizontal direction or a vertical direction;
    a transmission coil that transmits a high frequency signal at a predetermined resonance frequency with respect to a sample within a tubular vessel that is located in a static magnetic field;
    a superconductivity reception coil that receives a free induction decay signal; and
    an additional coil that has four electric current loops in which directions of electric currents that flow in an inner loop and an outer loop are opposite to each other,
    wherein the transmission coil has two electric current loops where a direction of electric current is the same on the two electric current loops, and the respective two electric current loops of the transmission coil are arranged substantially in the middle of the inner loop and the outer loop of the additional coil.

6. The nuclear magnetic resonance system according to claim 5, wherein a direction of a high frequency magnetic field that is developed in the center of the additional coil when electricity is fed to the additional coil is substantially identical with a direction of a high frequency magnetic field that is developed in the center of the transmission coil when electricity is fed to the transmission coil.

* * * * *